United States Patent
Senn et al.

(10) Patent No.: US 11,360,155 B2
(45) Date of Patent: Jun. 14, 2022

(54) BATTERY STATE OF HEALTH ESTIMATOR

(71) Applicants: VOLKSWAGEN AKTIENGESELLSCHAFT, Wolfsburg (DE); AUDI AG, Ingolstadt (DE); DR. ING. H.C. F. PORSCHE AKTIENGESELLSCHAFT, Stuttgart (DE)

(72) Inventors: Melanie Senn, Mountain View, CA (US); Joerg Christian Wolf, Foster City, CA (US); Lorenz Haghenbeck Emde, Menlo Park, CA (US)

(73) Assignees: VOLKSWAGEN AKTIENGESELLSCHAFT, Wolfsburg (DE); AUDI AG, Ingolstadt (DE); DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 5 days.

(21) Appl. No.: 17/011,103

(22) Filed: Sep. 3, 2020

(65) Prior Publication Data
US 2022/0065939 A1 Mar. 3, 2022

(51) Int. Cl.
*G01R 31/392* (2019.01)
*G06N 3/08* (2006.01)

(52) U.S. Cl.
CPC ........... *G01R 31/392* (2019.01); *G06N 3/088* (2013.01)

(58) Field of Classification Search
CPC .............................. G01R 31/392; G06N 3/088
See application file for complete search history.

(56) References Cited

U.S. PATENT DOCUMENTS

| | | | |
|---|---|---|---|
| 10,877,634 B1* | 12/2020 | Sica | G06Q 10/047 |
| 11,080,590 B2* | 8/2021 | Smolyanskiy | G06T 1/20 |
| 2019/0019080 A1* | 1/2019 | Claessens | G06Q 50/06 |
| 2019/0209022 A1* | 7/2019 | Sobol | A61B 5/0002 |
| 2019/0392818 A1* | 12/2019 | Lee | G06N 20/00 |
| 2020/0134461 A1* | 4/2020 | Chai | G06N 3/088 |
| 2020/0164763 A1* | 5/2020 | Holme | B60L 58/10 |

(Continued)

FOREIGN PATENT DOCUMENTS

CN 111027625 A 4/2020

OTHER PUBLICATIONS

World Intellectual Property Organization, Application No. PCT/EP21/73081, International Search Report dated Dec. 23, 2021.

*Primary Examiner* — Raymond L Nimox
(74) *Attorney, Agent, or Firm* — Wong & Rees LLP; Kirk D. Wong

(57) ABSTRACT

A computing system, method, and apparatus for determining a state of health indication for a battery are provided. A first supervised deep neural network ("DNN") is trained using received characteristics for the battery as input and received process parameters as outputs. An unsupervised AI estimator is trained using one or more clustering methods based on extracted features from the first supervised DNN, where the received characteristics are input to the unsupervised AI estimator. A second supervised DNN is trained using identified clusters from the unsupervised AI estimator. The identified clusters are validated with state of health indications. User battery data is inputted to the second supervised DNN to determine the state of health for the battery.

20 Claims, 10 Drawing Sheets

(56) References Cited

U.S. PATENT DOCUMENTS

| | | | |
|---|---|---|---|
| 2020/0202844 A1* | 6/2020 | Lee | G06N 7/005 |
| 2020/0211580 A1* | 7/2020 | Lee | G10L 21/0216 |
| 2020/0269709 A1* | 8/2020 | Herring | G01R 31/396 |
| 2020/0269719 A1* | 8/2020 | Aykol | G06N 20/00 |
| 2020/0269722 A1* | 8/2020 | Aykol | B60L 3/12 |
| 2020/0271725 A1* | 8/2020 | Herring | B60L 3/12 |
| 2021/0056412 A1* | 2/2021 | Jung | G06N 3/0445 |
| 2021/0334656 A1* | 10/2021 | Sjögren | G06K 9/6215 |

* cited by examiner

BATTERY STATE OF HEALTH ESTIMATOR

CROSS-REFERENCE TO RELATED APPLICATIONS

None.

FIELD

The present disclosure relates to methods, apparatuses, and systems for a battery state of health estimator and, more particularly, to a battery state of health estimator using induced domain knowledge for supervised learning.

BACKGROUND

Deep neural networks ("DNNs") are widely used for many artificial intelligence ("AI") applications including computer vision, autonomous vehicles, speech recognition, language translations, advertising, cancer detection, and robotics. Machine learning methods to develop DNNs are divided into supervised learning and unsupervised learning. In supervised learning, trustworthy labels are given as output data (i.e., the ground truth) in addition to the given input data to train a DNN. In unsupervised learning, labels are not available and/or not trusted since the accuracy of such measurements are insufficient. Rather, the outputs are grouped together in clusters based on their similarity in the feature space.

Attempts have been made to apply unsupervised learning methods to take observable battery characteristics as input and output an unknown state of health ("SoH") for that observed battery. The SoH is an indicator to quantify an aging level for a battery in terms of capacity fade and/or internal resistance. SoH estimation is crucial for improving battery life, understanding battery operation, and gaining increased performance from the battery.

The SoH can be generally estimated by experimental and model-based methods. Experimental methods monitor battery behaviors by analyzing the full cycle of experimental data of battery voltage, current, and temperature. Model-based estimation methods can be further divided into physical mechanism-based state estimation methods and data-driven methods.

While the battery SoH can be measured with sufficient accuracy from accelerated lab tests on the cell level, it is difficult to measure these quantities adequately at module/pack level in electric vehicles for representative driving and charging behavior in the real word. Even a simple task of a precise measurement of status of charge ("SoC") for a battery is a challenge in current electric vehicles. Currently, a SoC estimation is only approximated by a discrete open circuit voltage lookup tables, where the lookup tables map the relationship from voltage (ideally in rest) to SoC. However, such mapping does not take into account hysteresis in degradation of the battery. Furthermore, the voltage-based measurement of SoC is impractical for batteries in electric vehicles that constantly experience repeated small loads for housekeeping functions (such as data acquisition and upload, temperature control, and/or load balancing) that leads to a quasi-closed circuit voltage that violates the open circuit voltage assumption. In current battery management and control systems ("BMS"), battery degradation is not adequately represented by SoC or by SoH measurements due to limited real-time modeling experience as well as limited compute and memory capabilities for applying model-based estimation.

FIG. 1 illustrates a prior art block diagram for determining battery SoH using an unsupervised estimator. Unsupervised learning can be implemented by clustering (e.g. k-means clustering) on features from an input signal (e.g., observed battery characteristics) or by training an autoencoder as an unsupervised DNN 10. In cluster identification, the goal is to minimize the similarity in data between clusters and at the same time maximize the similarity in the data within clusters. If adequate features are extracted from input data, desired cluster borders indicating battery state of health can be found, which shows clearly separable clusters. However, undesired cluster borders are found since it is extremely difficult to choose features properly. Furthermore, the clustering algorithm is not suited for the available data since parameter thresholds are poorly formulated. The result is a mix of overlapping features in one cluster to another cluster, thereby obfuscating any useful information.

Therefore, it is important to develop new techniques that enable generating a battery state of health indication using a supervised DNN having a hybrid approach of supervised and unsupervised learning methods for trainings.

BRIEF DESCRIPTION OF THE FIGURES

The present disclosure is illustrated by way of example and not limitation in the figures of the accompanying drawings, in which like references indicate similar elements and in which.

DETAILED DESCRIPTION OF THE EMBODIMENTS

Figure 1:
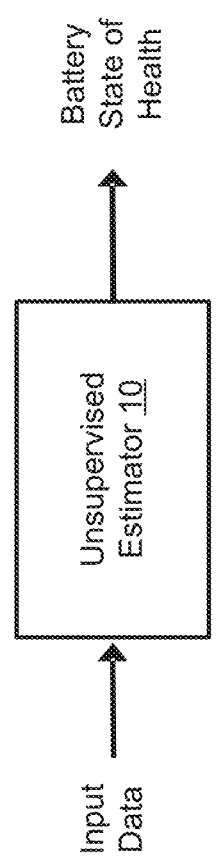
FIG. 1 illustrates a prior art block diagram for determining a battery state of health using an unsupervised estimator.

The figures and descriptions provided herein may have been simplified to illustrate aspects that are relevant for a clear understanding of the herein described devices, systems, and methods, while eliminating, for the purpose of clarity, other aspects that may be found in typical devices, systems, and methods. Those of ordinary skill in the art may recognize that other elements and/or operations may be desirable and/or necessary to implement the devices, systems, and methods described herein. Because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Physics-based phenomena can be modeled using either domain-knowledge driven physical models that describe a limited number of identified dominating mechanisms (such as thermal, electrochemical, and aging effects in estimation of battery life) or purely data-driven models such as Kalman filters or machine learning. For instance, various approaches include: (1) physical and chemical modelling including battery aging effects, (2) a weighted approach based on outlier detection, and (3) SN curves as an event-oriented concept. A data-driven approach can be used for prediction of battery life taking into account any capacity degradation. For instance, a battery's status of charge is estimated by Kalman filters, while SoH, including degradation due to aging, can be determined by least squares regression. Inducing knowledge about the physical behavior can improve model accuracy by a physical-driven feature extraction.

Ideally, both modeling from domain knowledge and data can be combined to minimize any remaining error from an analytical model that describes only a limited number of major mechanisms. There can be two approaches to bring the various modeling approaches together.

First, modelling remaining error of an analytical model with machine learning allows for a decrease in the overall modeling error (and consequently an increase in the model accuracy). The remaining error is treated from a black box perspective and hence does not allow for identifying influences of new mechanisms.

Second, induction of domain knowledge into machine learning allows for deriving some basic domain knowledge from a design of experiments table, and enables the identification of new mechanisms by analyzing features governed by domain knowledge (e.g. more electrolyte degradation in lithium-ion batteries that experience high temperature gradients). The design of experiments table can include operating conditions of the experiments, such as outside temperature of the vehicle with a battery under test, set temperature of the controlled experiment, humidity of the controlled experiment, charging rate of the battery under test, a driver type for the corresponding battery under test (e.g., aggressive driver, moderate driver, or gentle driver relative to usage of the battery under test), etc.

The present disclosure may include domain knowledge from application engineering and machine learning from a data-centered approach. Typically, domain knowledge is neglected in purely data-driven models that only apply an optimization algorithm to extract optimal features from input data. However, domain knowledge can be used to derive characteristic features by a machine learning method (e.g., linear regression, logistic regression, etc.).

Specifically, domain knowledge is induced into supervised learning for a DNN to determine a battery SoH estimation. In vehicle applications, machine-learning models are optimized for deployment in vehicles with limited compute and memory capabilities. Thus, a vehicle can represent battery degradation in SoC and/or SoH in real time given computational constraints. However, there are no trustworthy labels generated from reliable battery measurements for SoC and/or SoH indications. The present disclosure uses a supervised learning approach to induce knowledge from design of experiments and transfer that induced knowledge from cell, to module, and finally to pack level in the vehicle for real world driving and charging scenarios.

Improved predictions are achieved by using domain knowledge as trustworthy labels in a supervised DNN to extract better features for an unsupervised DNN in order to benefit from both their strengths.

Figure 2:
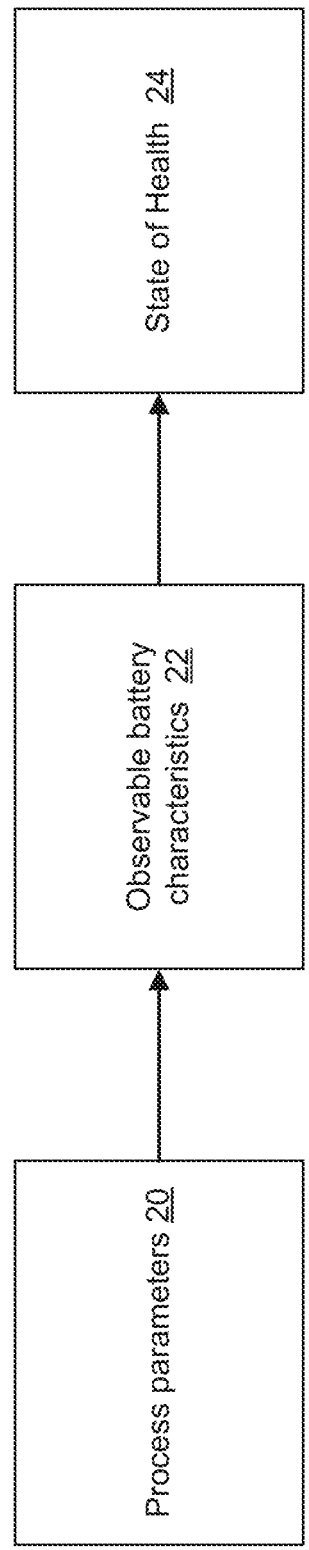
FIG. 2 illustrates a block diagram for using process parameters and observed battery characteristics to generate a state of health indication for a battery.

FIG. 2 illustrates a block diagram for using process parameters and observed battery characteristics to generate a state of health indication for a battery. An underlying dataset contains measurable battery characteristics (such as a time series of temperature, voltage, and current signals for a battery) resulting from process parameters such as set temperature, SoC at start and at end of the experiment, and charging and discharging rates for the experiments. If reliable labels are not available to quantify the battery state (such as measurements of battery capacity, battery SoH, and/or internal resistance of the battery), a supervised approach can be introduced.

A supervised classification DNN is trained by inducing the domain knowledge of the process parameters 20 as class labels. Second, the DNN's features are used for clustering. Different class labels can be obtained by binning (e.g., dividing continuous values into discretized bins, such as 40-55 degrees Celsius for high temperatures) the values of the process parameters (e.g. low/medium/high C-rate or temperature). Alternatively to a classifier, a regression DNN can be trained to approximate the process parameters as output quantities directly without binning. In either cases, the features in the convolutional layers characterize the input data of observable battery characteristics 22 and the underlying process parameters 20. By a knowledge-induction step, the features are enforced to develop during training with respect to input quantities and process parameters at the same time. Next, the features are used for unsupervised training of an artificial intelligence ("AI") estimator. Supervised training can be performed on the AI estimator to develop a supervised DNN for outputting state of health indications 24 based on observable battery characteristics 22. It can be appreciated the AI estimator can be an AI algorithm (e.g., a machine learning algorithm, deep learning algorithm, or combination thereof) trained using unlabeled data (i.e., without ground truth prediction reference from measurements or simulations).

Figure 3:
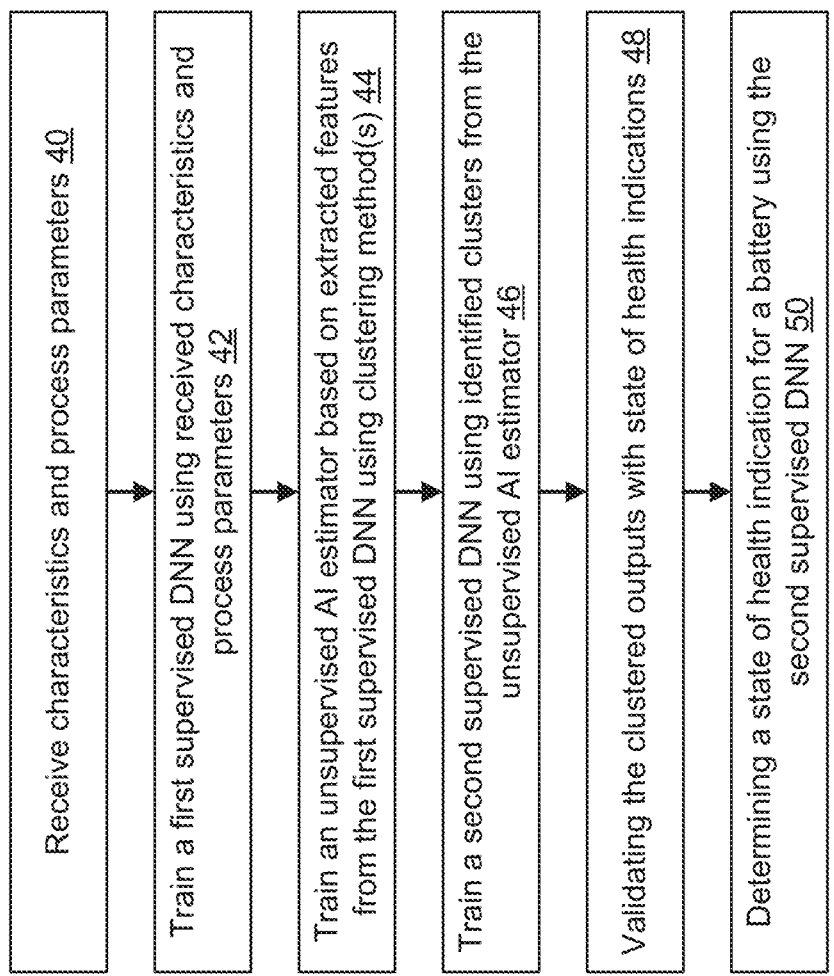
FIG. 3 illustrates a flow chart for an embodiment of the present disclosure to generate a state of health indication for a battery.

FIG. 3 illustrates a flow chart for an embodiment of the present disclosure to generate a state of health indication for a battery. In order to determine a SoH for a battery, battery characteristics and process parameters for the battery are received to be used as training data 40. The battery characteristics include observable quantities of the battery. For instance, a BMS may be coupled to the battery for management of the battery load and cooling of the battery. The BMS may measure various characteristics of the battery, including a battery temperature, a battery voltage, a battery electrical current, number of charge cycles, charging profile, discharging profile, etc. The measured characteristics can be measured over a predefined period time to generate a function of the specific characteristics. The process parameters are generated by measuring the external factors applied to the battery, e.g., set temperature of the design of experiments, the start and/or end of the SoC, charge rate, etc. The process parameters can individually influence a particular battery's workload and can lead to an individualized degradation for that particular.

A supervised deep neural network ("DNN"), referred to as a first supervised DNN, is trained using the received characteristics as input and received process parameters as outputs 42. The supervised DNN can be trained using various supervised learning algorithms, including convolutional layers (plus max pooling) with a couple of fully connected layers, ResNet, U-Net, or other DNN architectures. In this manner, the features of the supervised DNN are induced from the known quantities of the received battery characteristics and the process parameters.

The features from the supervised DNN are extracted and then used for training an unsupervised AI estimator 44. The unsupervised AI estimator can be trained based on the extracted features from the supervised DNN using one or more clustering methods. For instance, a machine learning algorithm for clustering such as k-means can be applied. During unsupervised training, the received battery characteristics are inputted to the unsupervised AI estimator. Identified clusters can be found from the AI estimator. It can be appreciated that another step can be included in which at least one flatten layer is removed from the supervised DNN so that the features can be extracted and remapped for another class outputs (e.g., SoH indications).

Next, a second supervised DNN is trained using identified clusters (also referred to as "groups") from the unsupervised AI estimator 46. The outputs of the unsupervised AI estimator can be clustered using a classification algorithm. For instance, outputs of the unsupervised DNN can be clustered by dividing continuous values into discretized bins. Alternatively, the outputs can be clustered using a DNN regression algorithm. It can be appreciated that other classification/clustering algorithms can be used as well. Once clustered, the clustered outputs are validated with SoH indications 48.

Once the second supervised DNN is determined, battery characteristics (or also referred to as user battery data) for a specific battery are inputted to the second supervised DNN to determine a SoH indication 50. High-effort SoH measurements can be performed for representative, measurable battery characteristics to assign clusters of the output of the second supervised DNN to a SoH indication (e.g. low/medium/high health or 10/50/90% battery health). It can be appreciated that the user battery data can be the received battery characteristics, a battery data set for a specific battery, or a combination thereof.

In vehicle applications, user battery data is monitored and stored by a BMS, e.g., battery usage, charging and discharging cycle data for the battery, etc., giving a user profile corresponding to that battery. It can be appreciated that the second supervised DNN can be retrained using the validated SoH indications to further refine the feature map of the second supervised DNN (e.g. to customize the estimator to different regions/drivers).

Figure 4:
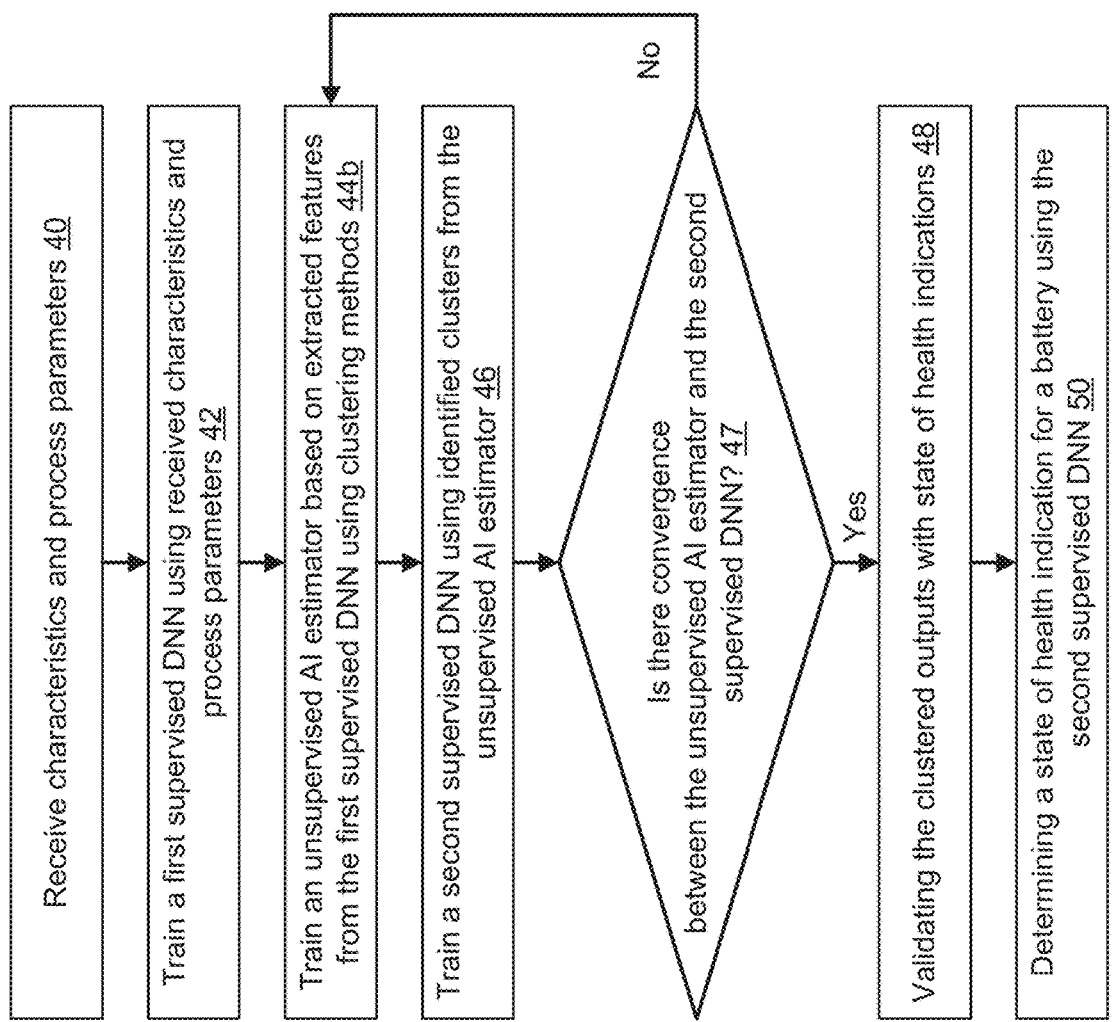
FIG. 4 illustrates a flow chart for another embodiment of the present disclosure to generate a state of health indication for a battery.

FIG. 4 illustrates a flow chart for another embodiment of the present disclosure for generating a state of health indication for a battery. The overall process of inducing domain knowledge for SoH estimation can include combining unsupervised (e.g., clustering) and supervised (e.g., classification/regression) training approaches. The training of the unsupervised AI estimator 44b and training of the second supervised DNN 46 can be repeated a number of times until convergence condition is met 47. For instance, the steps 44b and 46 can be repeated based on a predefined number of repetitions, modified clustering convergence criteria, whether a predefined accuracy is achieved by training the second DNN, or combination thereof. During retraining in step 44b, the features are extracted from the previous, unsupervised AI estimator and used for retraining. Thus, after each repetition in step 44b, outputs of the unsupervised AI estimator can be refined from a coarse number to a finer number of classifications.

Figure 5:
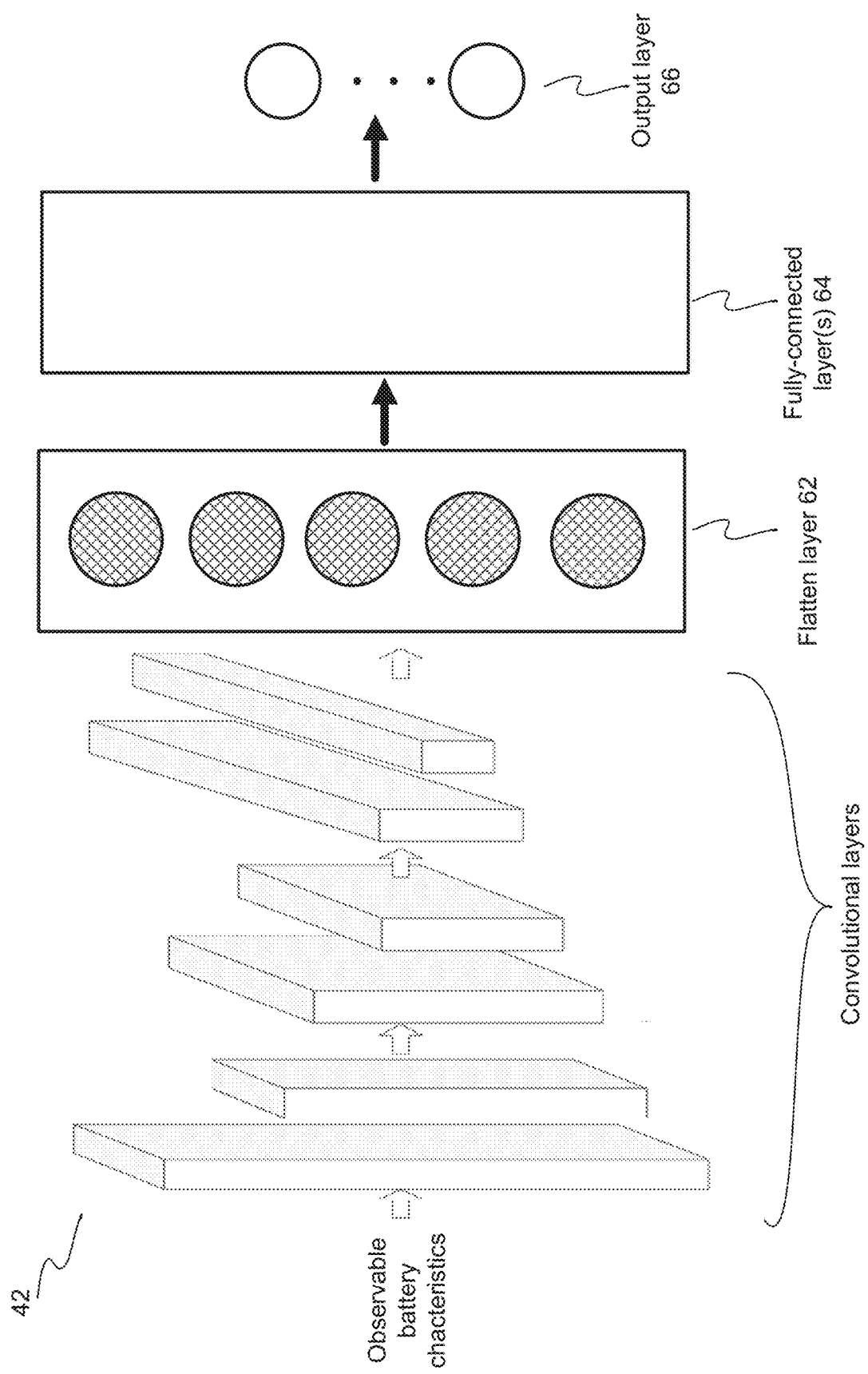
FIG. 5 illustrates a diagram for applying supervised learning to a deep neural network to determine known process parameters for a battery.

FIG. 5 illustrates a diagram for applying supervised learning to a deep neural network to determine known process parameters for a battery. In an embodiment, a supervised DNN 42 comprises convolutional layers 60 for feature extraction, a flatten layer 62, fully-connected layer(s) 64, and an output layer 66. The flatten layer 62 is between the convolutional layers 60 for feature extraction and the fully-connected layer(s) for regression. The output layer 66 provides classifications or regression values based on the output of the fully-connected layer(s) 64.

The features from the convolution layers are extracted as vectorized quantity (with flatten layer) for feature-based clustering. This feature vector can then be used for generating clusters as it relates to SoH indications. Since the extracted features represent characteristics in both process parameters and observed battery characteristics, the identified clusters in the feature vector space may have related characteristics for representation as desired clusters for battery SoH estimation. Thus, the identified clusters can then be relabeled with respect to the correlated, but unlabeled output of SoH values. SoH values can include a percentage relative to a total ideal capacity of 100% for a non-degraded battery. For instance, 10% may mean that the battery under test may have degraded to the point where it can only hold preset percentage of the charge of a non-degraded battery. Alternatively, the SoH indications can comprise relative terminology of various states, including "bad", "medium", or "good" SoH indications. The various states can correspond to threshold percentage values of the SoH or SoC.

Figure 6:
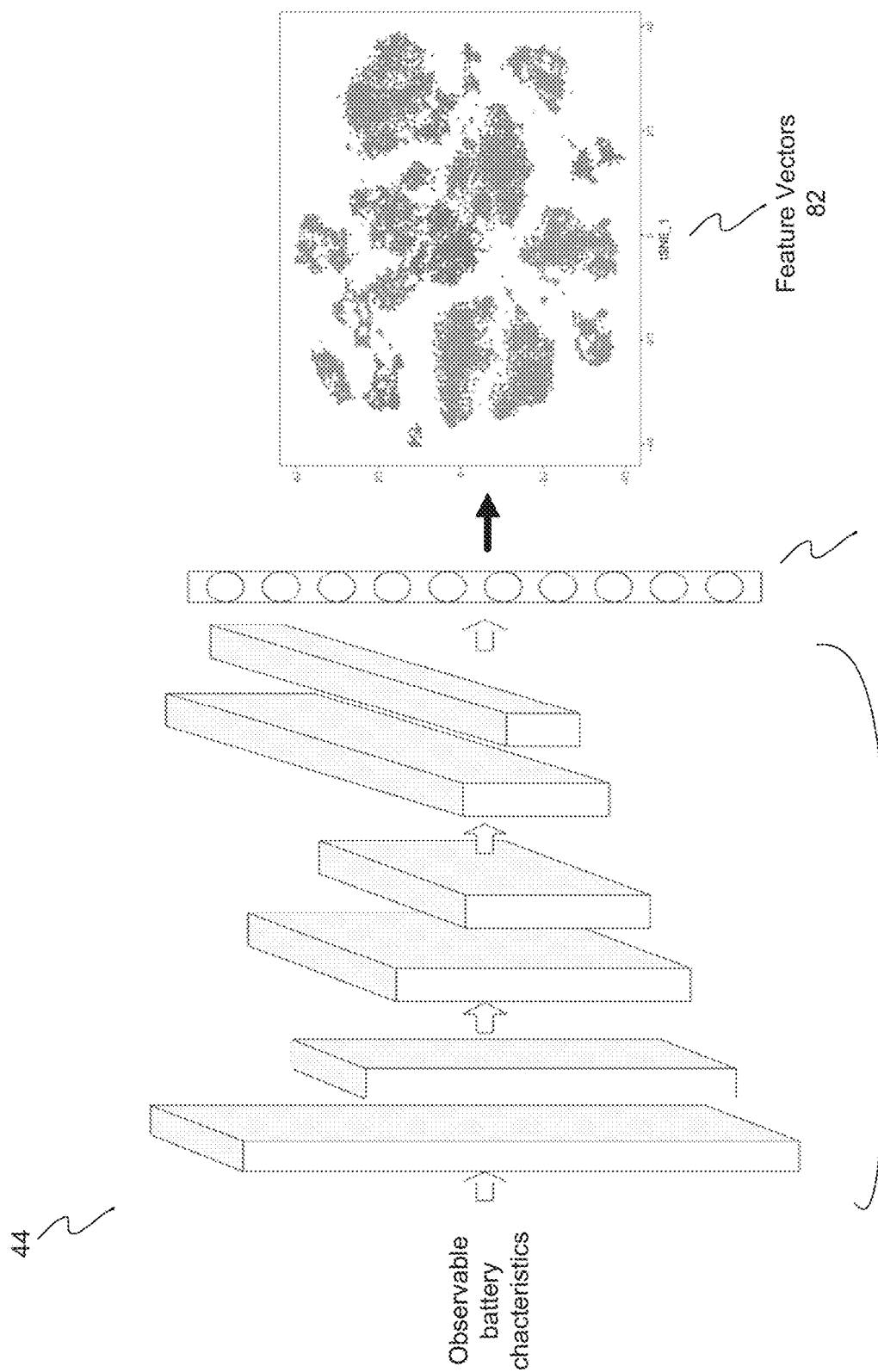
FIG. 6 illustrates a diagram for applying unsupervised learning to a deep neural network to determine a state of health indication for a battery using extracted features from another DNN for determining process parameters for the battery.

FIG. 6 illustrates a diagram for applying unsupervised learning to a deep neural network. Observable battery characteristics are inputted to convolutional layers 78. The convolutional layers are extracted features from a supervised DNN that was trained with the battery characteristics and the process parameters. The convolutional layers output to a flatten layer 80 to generate feature vectors 82. The flatten layer transforms the 2D and/or 3D features from convolutional layers 78 to vector quantities. The feature vectors 82 from the output of the flatten layer 80 can be clustered using one or more clustering algorithms to generate borders around similar feature vectors.

Figure 7:
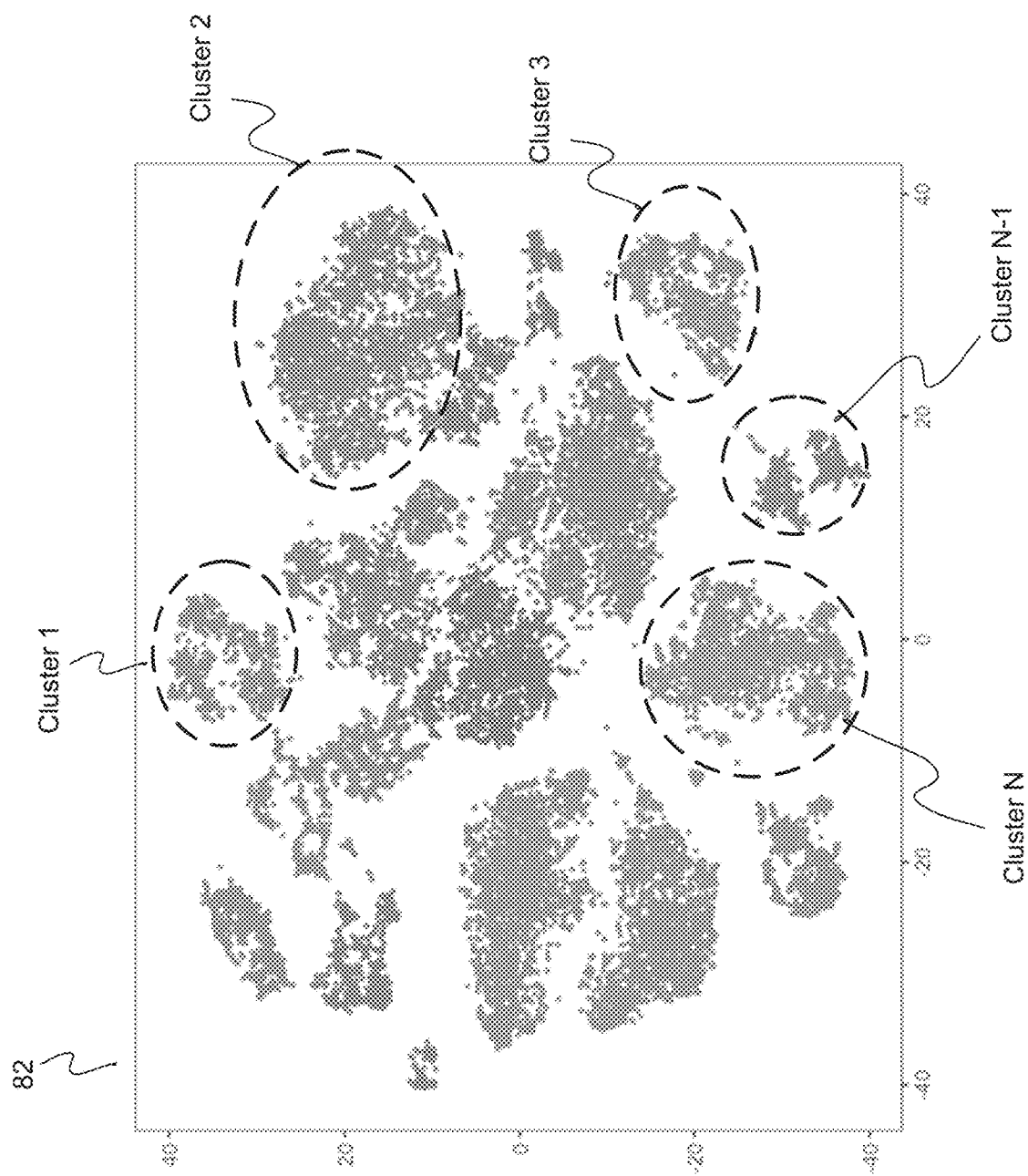
FIG. 7 illustrates a graph diagram for clustering outputs of an unsupervised deep neural network.

FIG. 7 illustrates a graph diagram for clustering outputs of an unsupervised deep neural network. During training of the unsupervised AI estimator step 44, the feature vectors 82 can be clustered using an unsupervised learning algorithm. Since the feature extraction from the supervised DNN (including process parameters as domain knowledge) is used to generate the feature vectors 82, the borders of the feature vectors 82 are more easily determined based on more meaningful features.

As an example, the clustering algorithm may identify cluster 1, cluster 2, cluster 3, . . . , cluster N−1, and cluster N as distinct clusters. The number of clusters can be selected based on a predefined amount or dependent on a specific threshold.

Figure 8:
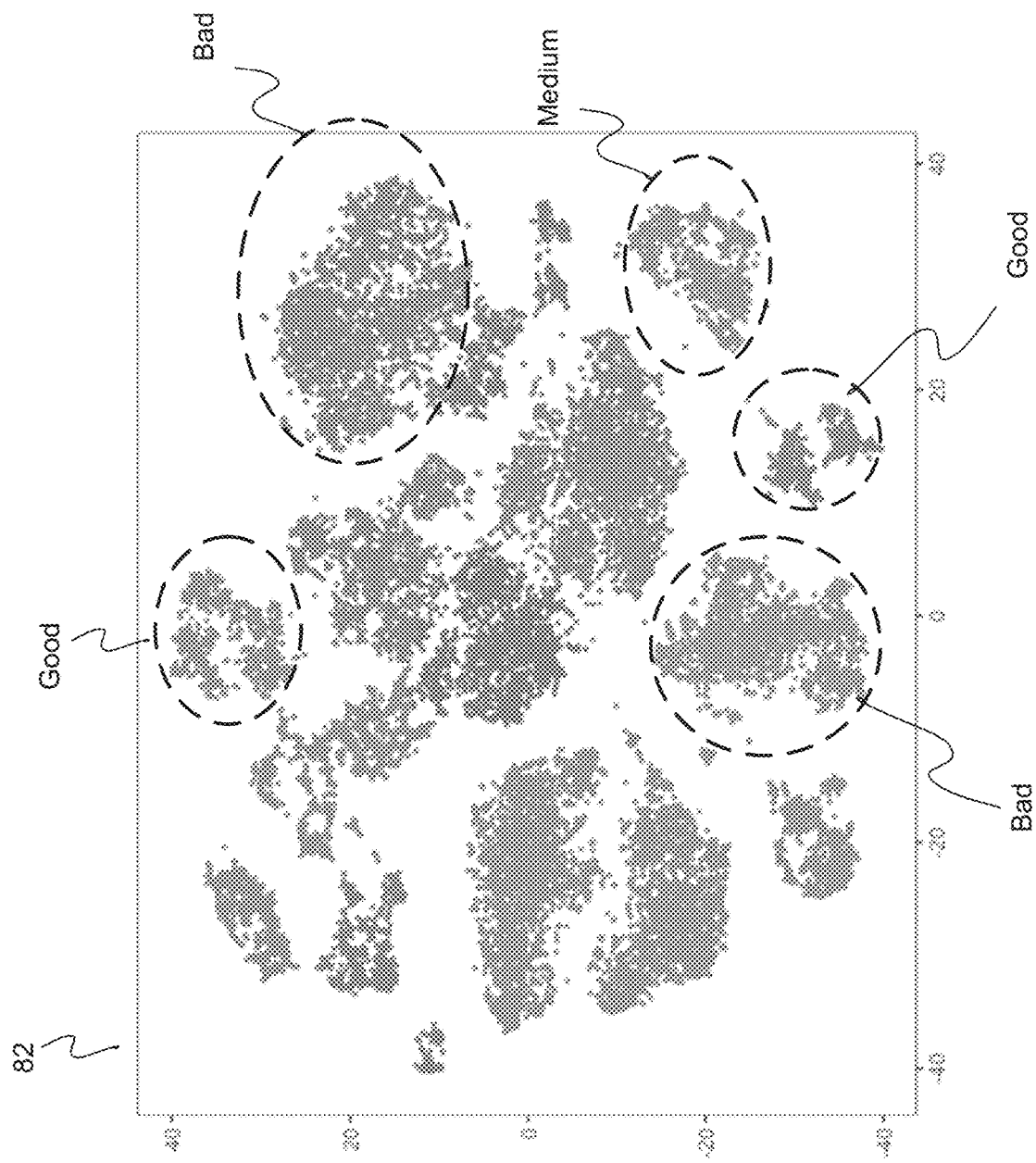
FIG. 8 illustrates a graph diagram for validating SoH categories (from few available ground truth measurements) for unsupervised clusters in a feature vector space.

FIG. 8 illustrates a graph diagram for validating SoH classifiers for unsupervised clusters in a feature vector space. Once the clusters are identified in the feature vectors 82, representative sample(s) from each cluster can be used to validate what SoH indication corresponds with that respective cluster.

For instance, based on testing for SoH of the representative sample(s) from cluster 1, cluster 1 can be associated with a "Good" SoH indication. Furthermore, representative sample(s) from each of the other clusters can be tested for a SoH indication and then the cluster can be associated with that SoH indication. In this example, cluster 2 is associated with a "Bad" SoH indication; cluster 3 is associated with "Medium" SoH indication.

Figure 9:
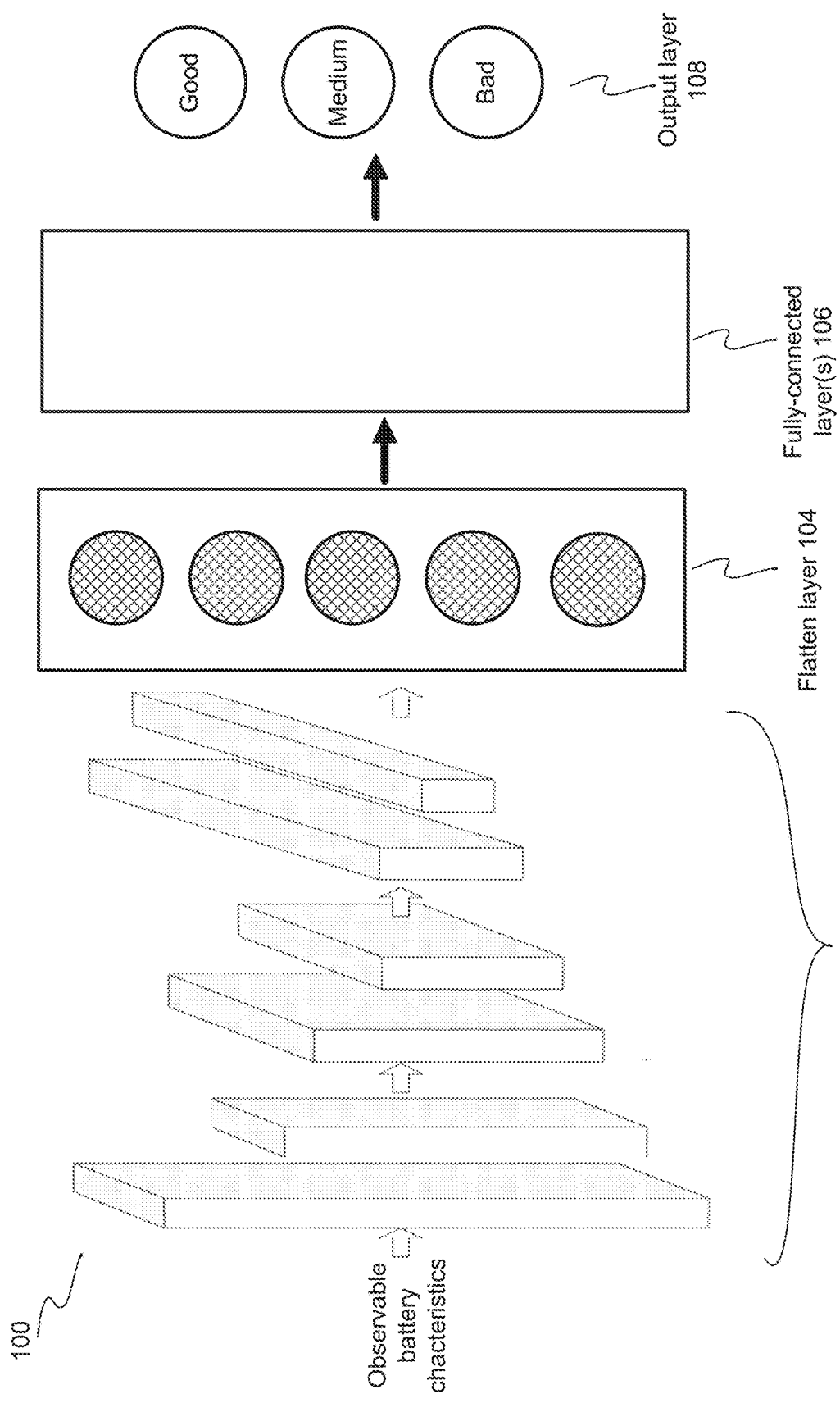
FIG. 9 illustrates a diagram for a supervised DNN that determines a battery SoH indication based on observable battery characteristics.

FIG. 9 illustrates a diagram for a supervised DNN of the present disclosure for determining a battery SoH indication based on observable battery characteristics. A supervised DNN 100 comprises convolutional layers 102, flatten layer 104, fully-connected layer(s) 106, and an output layer 108. The output layer 108 can have SoH indications, e.g., "good", "bad", and "medium". The features of the supervised DNN can be derived from previous supervised (classification/regression by process parameters) and unsupervised (clustering) steps. The unsupervised step was reformulated as a supervised step with the identified clusters as labels. Once trained, the supervised DNN 100 can be used to evaluate a particular battery for a SoH indication. In particular, the observable battery characteristics are inputted to the second supervised DNN to generate a SoH indication of "good", "bad", and/or "medium".

Figure 10:
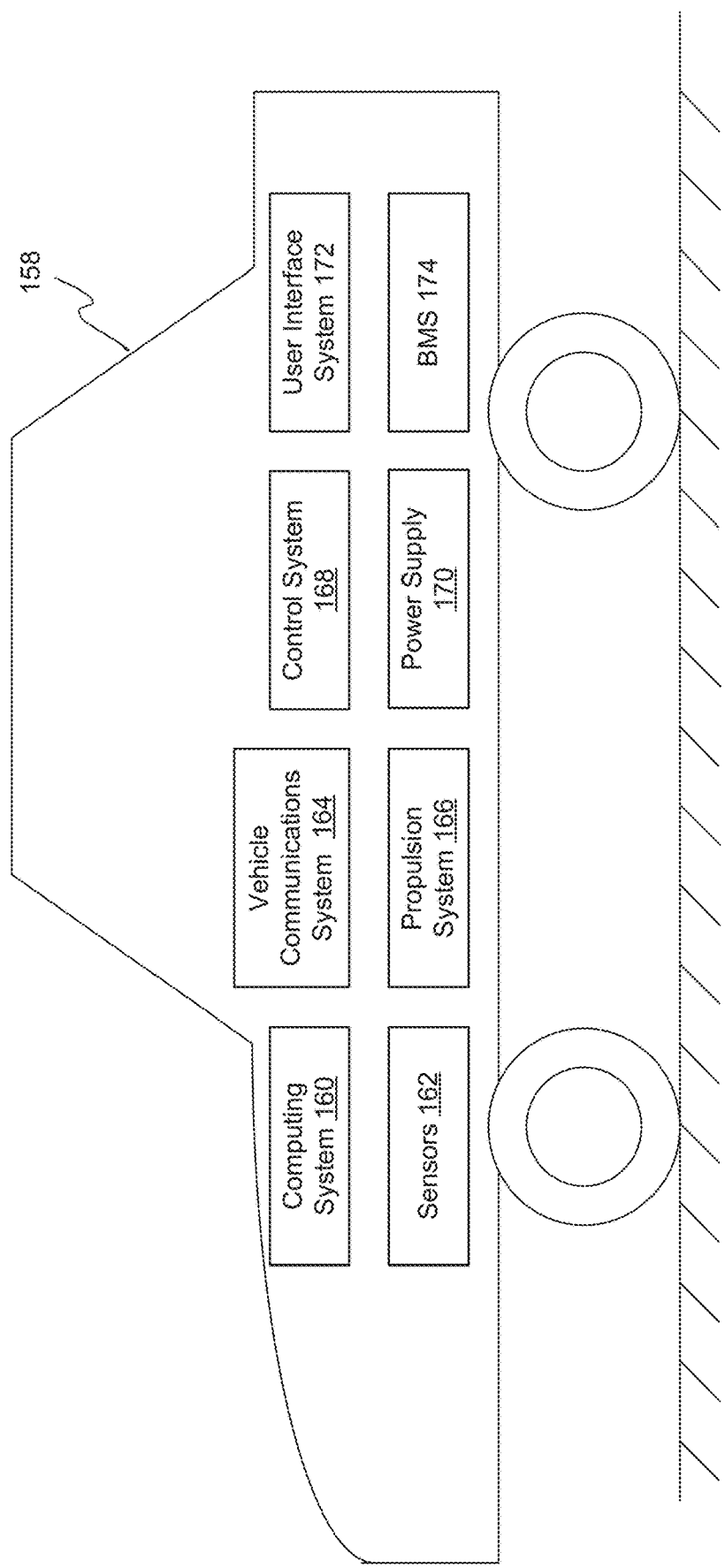
FIG. 10 illustrates a simplified block diagram of a vehicle in accordance with an example embodiment of the present disclosure.

FIG. 10 illustrates a simplified block diagram of a vehicle in accordance with an example embodiment of the present disclosure. In an example embodiment, a vehicle 158 comprises a computing system 160, sensors 162, a vehicle communications system 164, a propulsion system 166, a control system 168, a power supply 170, a user interface system 172, and a battery management system 174. In other embodiments, the vehicle 158 may include more, fewer, and/or different systems, and each system may include more, fewer, and/or different components. Additionally, the systems and/or components may be combined and/or divided in a number of arrangements.

The computing system 160 may be configured to transmit data to, receive data from, interact with, and/or control one or more of the propulsion system 166, the sensors 162, the control system 168, BMS 174, and any other components of the vehicle 158. The computing system 160 may be communicatively linked to one or more of the sensors 162, vehicle communications system 164, propulsion system 166, control system 168, power supply 170, user interface system 172, and BMS 174 by a system bus (e.g., CAN bus, Flexray, etc.), a network (e.g., via a vehicle-to-vehicle, vehicle-to-infrastructure, vehicle-to-device, and so on), and/or other connection mechanism.

In at least one embodiment, the computing system 160 may be configured to store data in a local data storage and/or communicatively coupled to an external data storage. It can be appreciated that the data can also be transmitted to a cloud service and received from the cloud service via over-the-air ("OTA") wireless techniques. For instance, OTA wireless technique can be used to transmit updated DNN models or to upload interesting data such as corner cases.

In another embodiment, the computing system 160 may be configured to cause the sensors 162 to capture images of the surrounding environment of the vehicle 158. In yet another embodiment, the computing system 160 may control operation of the propulsion system 166 to autonomously or semi-autonomously operate the vehicle 158. As yet another example, the computing system 160 may be configured to store and execute instructions corresponding to an algorithm (e.g., for steering, braking, and/or throttling) from the control system 170. As still another example, the computing system 160 may be configured to store and execute instructions for determining the environment around the vehicle 158 using the sensors 162. Even more so, the computing system 160 may be configured to store and execute instructions for operating the BMS 174 and a supervised DNN for indicating the SoH of a battery of the vehicle 158. The BMS 174 and/or computing system 160 can sense and record battery characteristics including, temperature, voltage, and current, via the CAN data every predefined number of hours and/or days. The supervised DNN can use this information as input and generate a SoH indication for that battery. Based on the generated SoH indication, user feedback can be provided the user of the vehicle valuable direction to preserve the SoH of the battery (e.g., do not perform three fast charges in a row). These are just a few examples of the many possible configurations of the computing system 160.

The computing system 160 can include one or more processors. Furthermore, the computing system can have its own data storage and/or use an external data storage. The one or more processors may comprise one or more general-purpose processors and/or one or more special-purpose processors. To the extent the processor includes more than one processor, such processors could work separately or in combination. Data storage of the computing system 160, in turn, may comprise one or more volatile and/or one or more non-volatile storage components, such as optical, magnetic, and/or organic storage. The data storage may be integrated in whole or in part with the one or more processors of the computing system 160 and may be communicatively coupled to the data storage. In some embodiments, data storage of the computing system 160 may contain instructions (e.g., program logic) executable by the processor of the computing system 160 to execute various vehicle functions (e.g., the methods disclosed herein).

The term computing system may refer to data processing hardware, e.g., a CPU and/or GPU, and encompasses all kinds of apparatus, devices, and machines for processing data, including by way of example a programmable processor, a computer, multiple processors, computers, cloud computing, and/or embedded low-power devices (e.g., Nvidia Drive PX2). The system can also be, or further include, special purpose logic circuitry, e.g., an FPGA (field programmable gate array) or an ASIC (application-specific integrated circuit). The system can optionally include, in addition to hardware, code that creates an execution environment for computer programs, e.g., code that constitutes processor firmware, a protocol stack, a database management system, an operating system, or a combination of one or more of them. A computer program can also be used to emulate the computing system.

A computer program which may also be referred to or described as a program, (software, a software application, an app, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating outputs. The processes and logic flows can also be performed by special purpose logic circuitry, e.g., an FPGA or an ASIC, or by a combination of special purpose logic circuitry and one or more programmed computers.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include wired and/or wireless local area networks ("LANs") and wired and/or wireless wide area networks ("WANs"), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

The sensors 162 may include a number of sensors configured to sense information about an environment in which the vehicle 158 is located, as well as one or more actuators configured to modify a position and/or orientation of the sensors. The sensors can include a global positioning system ("GPS"), an inertial measurement unit ("IMU"), a RADAR unit, a laser rangefinder and/or one or more LIDAR units, and/or a camera. In some embodiments, the sensors 162 may be implemented as multiple sensor units each mounted to the vehicle in a respective position (e.g., top side, bottom side, front side, back side, right side, left side, etc.). Other sensors are possible as well.

The vehicle communications system 164 may be any system communicatively coupled (via wires or wirelessly) to one or more other vehicles, sensors, or other entities, either directly and/or via a communications network. The wireless communication system 164 may include an antenna and a chipset for communicating with the other vehicles, sensors, servers, and/or other entities either directly or via a communications network. The chipset or wireless communication system 164 in general may be arranged to communicate according to one or more types of wireless communication (e.g., protocols) such as BLUETOOTH, communication protocols described in IEEE 802.11 (including any IEEE 802.11 revisions), cellular technology (such as V2X, V2V, GSM, CDMA, UMTS, EV-DO, WiMAX, or LTE), ZIG-BEE, dedicated short range communications (DSRC), and radio frequency identification ("RFID") communications, among other possibilities. The wireless communication system 164 may take other forms as well.

The propulsion system 166 may be configured to provide powered motion for the vehicle 158. The propulsion system 166 may include various components to provide such motion, including an engine/motor, an energy source, a transmission, and wheels/tires. The engine/motor may include any combination of an internal combustion engine, an electric motor (that can be powered by an electrical battery, fuel cell, and/or other energy storage device), and/or a steam engine. Other motors and engines are possible as well.

The control system 168 may be configured to control operation of the vehicle 158 and its components. The control system 168 may include various components, including a steering unit, a throttle, a brake unit, a perception system, a navigation or pathing system, and an obstacle avoidance system.

A perception system may be any system configured to process and analyze images and/or sensor data captured by the sensors (e.g., a camera, RADAR and/or LIDAR) of the vehicle 158 in order to identify objects and/or features in the environment in which the vehicle 158 is located, including, for example, traffic signals and obstacles. To this end, the perception system may use an object recognition algorithm, a Structure from Motion ("SFM") algorithm, video tracking, or other computer vision techniques. In some embodiments, the perception system may additionally be configured to map the environment, track objects, estimate the speed of objects, etc.

In at least one embodiment, the overall system can comprise a perception subsystem for identifying objects, a planning subsystem for planning a smooth driving path around the obstacles, and a control subsystem for executing the path from the planner.

The power supply 170 may be a source of energy that powers the engine/motor of the vehicle 158 in full or in part and/or powers the electrical equipment of the vehicle 158. The engine/motor of the vehicle may be configured to convert the power supply 170 into mechanical energy. Examples of energy sources for the power supply 170 include gasoline, diesel, propane, other compressed gas-based fuels, ethanol, solar panels, batteries, and other sources of electrical power. The energy source(s) may additionally or alternatively include any combination of fuel tanks, batteries, capacitors, and/or flywheels. In some embodiments, the energy source may provide energy for other systems of the vehicle 158 as well.

In an embodiment, the power supply 170 is an electric battery that is communicatively coupled to the BMS 174. The BMS 174 monitors the various characteristics of the power supply 170, including battery temperature, battery voltage, battery current, and battery charging and discharging data. This information can be stored locally by the BMS 174 and/or the computing system 160. The BMS 174 can also transmit such monitored information via the vehicle communications system 164 to an external storage device (e.g., in the cloud). The BMS 174 may regulate the operating conditions of the power supply 170, e.g., cooling the battery temperature to within a predefined threshold temperature.

The computing system 160 can be configured to generate a SoH using a supervised DNN of the present disclosure. For instance, in an embodiment, a computing system, comprises: at least one data storage configured to store computer program instructions; and at least one processor communicatively coupled to the at least one data storage, the at least one processor is configured to execute the computer program instructions to perform the following, comprising: determining a state of health indication for a battery, further comprising the steps of: receiving characteristics and process parameters for the battery; training a first supervised deep neural network, where the received characteristics are inputs to the first supervised DNN and the received process parameters are outputs to the supervised DNN, training an unsupervised AI estimator based on extracted features from the first supervised DNN, where the received characteristics are inputs to the unsupervised AI estimator; training a second supervised DNN using identified clusters from the unsupervised AI estimator; validating the identified clusters with state of health indications; and determining a state of health indication for the battery using the second supervised DNN. The at least one data storage can be a non-transitory computer readable medium encoded with instructions that when executed by the at least one processor causes the processor to carry out the instructions. The SoH indication can be inputted to the BMS 174 for the BMS 174 to adjust the operating conditions of the power supply 170. In another embodiment, the supervised DNN for generating a SoH indication can be performed by one or more processors of the BMS 174.

The user interface system 172 may include software, a human-machine interface ("HMI"), and/or peripherals that are configured to allow the vehicle 158 to interact with external sensors, other vehicles, external computing devices, and/or a user. To this end, the peripherals may include, for example, a wireless communication system, a touchscreen, a microphone, and/or a speaker. The SoH indication or related metric (e.g., SoC) can be displayed via the user interface system 172.

In some embodiments, the vehicle 158 may include one or more elements in addition to or instead of those shown. For example, the vehicle 158 may include one or more additional interfaces and/or power supplies. Other additional components are possible as well. In such embodiments, the data storage of the computing system 160 may further include instructions executable by the processor of the computing system 160 to control and/or communicate with the additional components.

Still further, while each of the components and systems are shown to be integrated in the vehicle 158, in some embodiments, one or more components or systems may be removably mounted on or otherwise connected (mechanically or electrically) to the vehicle 158 using wired or wireless connections.

In an example embodiment, a cloud service and/or backend server can be configured to perform DNN compression (e.g., using similarity-based filter pruning, quantization, or other DNN compression method). Once the DNN is compressed, the cloud service and/or backend server can deploy the DNN to the vehicle 158 and the vehicle can perform inference using the compressed DNN on embedded hardware of the vehicle 158, e.g., by the computing system 160. Thereby, the supervised DNN for generating a SoH indication for the power supply 170 can be generated in real-time in the vehicle 158.

The computing system 160 can run the DNN predictions at runtime on embedded hardware that may have limited computing capabilities. Thus, multiple functions can be run simultaneously on the computing system. The compressed DNN size can lead to a small footprint in memory of the computing system 160 and can be transmitted quickly over wireless connections. Thus, when an improved DNN version is released, the improved DNN can be easily deployed to the vehicle 158 via the vehicle communications system 164 and processed by the computing system 160.

While the functionality of the disclosed embodiments and the system components used to provide that functionality have been discussed with reference to specific terminology that denotes the function to be provided, it should be understood that, in implementation, the component functionality may be provided, at least in part, components present and known to be included in conventional transportation vehicles.

For example, as discussed above, disclosed embodiments use software for performing functionality to enable measurement and analysis of data, at least in part, using software code stored on one or more non-transitory computer readable mediums running on one or more processors in a transportation vehicle. Such software and processors may be combined to constitute at least one controller coupled to other components of the transportation vehicle to support and provide autonomous and/or assistive transportation vehicle functionality in conjunction with vehicle navigation systems, and multiple sensors. Such components may be coupled with the at least one controller for communication and control via a CAN bus of the transportation vehicle or other busses (e.g., Flexray).

It should further be understood that the presently disclosed embodiments may be implemented using dedicated or shared hardware included in a transportation vehicle. Therefore, components of the module may be used by other components of a transportation vehicle to provide vehicle functionality without departing from the scope of the present disclosure.

Exemplary embodiments are provided so that this disclosure will be thorough, and will fully convey the scope to those who are skilled in the art. Numerous specific details are set forth, such as examples of specific components, devices, and methods, to provide a thorough understanding of embodiments of the present disclosure. In some illustrative embodiments, well-known processes, well-known device structures, and well-known technologies are not described in detail.

Terminology has been used herein for the purpose of describing particular illustrative embodiments only and is not intended to be limiting. The singular form of elements referred to above may be intended to include the plural forms, unless the context indicates otherwise. The method steps, processes, and operations described herein are not to be construed as necessarily requiring their performance in the particular order discussed or illustrated, unless specifically identified as an order of performance or a particular order is inherently necessary for embodiment to be operational. It is also to be understood that additional or alternative steps may be employed.

Disclosed embodiments include the methods described herein and their equivalents, non-transitory computer readable media programmed to carry out the methods and a computing system configured to carry out the methods. Further, included is a vehicle comprising components that include any of the methods, non-transitory computer readable media programmed to implement the instructions or carry out the methods, and systems to carry out the methods. The computing system, and any sub-computing systems, will typically include a machine-readable storage medium containing executable code; one or more processors; memory coupled to the one or more processors; an input device, and an output device connected to the one or more processors to execute the code. A machine-readable medium may include any mechanism for storing or transmitting information in a form readable by a machine, such as a computer processor. The information may be stored, for example, in volatile or non-volatile memory. Additionally, embodiment functionality may be implemented using embedded devices and online connection to cloud computing infrastructure available through radio connection (e.g., wireless communication) with such infrastructure.

It can be appreciated that embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain some cases, multitasking and parallel processing may be advantageous.

We claim:

1. A computing system, comprising:
   at least one data storage configured to store computer program instructions; and
   at least one processor communicatively coupled to the at least one data storage,
   the at least one processor is configured to execute the computer program instructions to perform the following, comprising:
      determining a state of health indication for a battery, further comprising the steps of:
         receiving characteristics and process parameters for the battery;
         training a first supervised deep neural network ("DNN"), where the received characteristics are inputs to the first supervised DNN and the received process parameters are outputs of the first supervised DNN;
         training an unsupervised AI estimator using one or more clustering methods based on extracted features from the first supervised DNN, where the received characteristics are inputs to the unsupervised AI estimator;
         training a second supervised DNN using identified clusters from the unsupervised AI estimator, where the received characteristics are inputs to the second supervised DNN;
         validating the identified clusters with state of health indications; and
         determining the state of health indication for the battery using the second supervised DNN.

2. The computing system of claim 1, wherein after the third training step and before the validating step, repeating the training the unsupervised AI estimator step and the training the second supervised DNN step until a convergence condition is met.

3. The computing system of claim 1, wherein in the second training step, the one or more clustering methods includes dividing continuous values for outputs of the unsupervised AI estimator into discretized bins.

4. The computing system of claim 1, wherein in the second training step, the one or more clustering methods includes applying a regression DNN to outputs of the unsupervised AI estimator.

5. The computing system of claim 1, wherein in the second training step, the one or more clustering methods includes applying subspace clustering with an auto-encoder for dimension reduction on outputs of the unsupervised AI estimator.

6. The computing system of claim 1, wherein the received characteristics include at least one from a group comprising a battery temperature, a battery voltage, and a battery electrical current.

7. The computing system of claim 1, wherein the received process parameters include at least one from a group comprising a charge rate for the battery, a state of charge of the battery, and a process temperature.

8. A computer-implemented method for determining a state of health indication for a battery, comprising:
   receiving characteristics and process parameters for the battery;
   training a first supervised deep neural network ("DNN"), where the received characteristics are inputs to the first supervised DNN and the received process parameters are outputs of the first supervised DNN;

training an unsupervised AI estimator using one or more clustering methods based on extracted features from the first supervised DNN, where the received characteristics are inputs to the unsupervised AI estimator;

training a second supervised DNN using identified clusters from the unsupervised AI estimator, where the received characteristics are inputs to the second supervised DNN;

validating the identified clusters with state of health indications; and determining the state of health indication for the battery using the second supervised DNN.

9. The computer-implemented method of claim 8, wherein after the third training step and before the validating step, repeating the training the unsupervised AI estimator step and the training the second supervised DNN step.

10. The computer-implemented method of claim 8, wherein in the second training step, the one or more clustering methods includes dividing continuous values for outputs of the unsupervised AI estimator into discretized bins.

11. The computer-implemented method of claim 8, wherein in the second training step, the one or more clustering methods includes applying a regression DNN to outputs of the unsupervised AI estimator.

12. The computer-implemented method of claim 8, wherein in the second training step, the one or more clustering methods includes applying subspace clustering with an auto-encoder for dimension reduction on outputs of the unsupervised AI estimator.

13. The computer-implemented method of claim 8, wherein the received characteristics include at least one from a group comprising a battery temperature, a battery voltage, and a battery electrical current.

14. The computer-implemented method of claim 8, wherein the received process parameters include at least one from a group comprising a charge rate for the battery, a state of charge of the battery, and a process temperature.

15. A non-transitory computer readable medium encoded with instructions that when executed by at least one processor causes the processor to carry out the following operations:

receiving characteristics and process parameters for a battery;

training a first supervised deep neural network ("DNN"), where the received characteristics are inputs to the first supervised DNN and the received process parameters are outputs of the first supervised DNN;

training an unsupervised AI estimator using one or more clustering methods based on extracted features from the first supervised DNN, where the received characteristics are inputs to the unsupervised AI estimator;

training a second supervised DNN using identified clusters from the unsupervised AI estimator, where the received characteristics are inputs to the second supervised DNN;

validating the identified clusters with state of health indications; and determining a state of health indication for the battery using the second supervised DNN.

16. The non-transitory computer readable medium of claim 15, wherein after the third training step and before the validating step, repeating the training the unsupervised AI estimator step and the training the second supervised DNN step.

17. The non-transitory computer readable medium of claim 15, wherein in the second training step, the one or more clustering methods includes dividing continuous values for outputs of the unsupervised AI estimator into discretized bins.

18. The non-transitory computer readable medium of claim 15, wherein in the second training step, the one or more clustering methods includes applying a regression DNN to outputs of the unsupervised AI estimator.

19. The non-transitory computer readable medium of claim 15, wherein in the second training step, the one or more clustering methods includes applying subspace clustering with an auto-encoder for dimension reduction on outputs of the unsupervised AI estimator.

20. The non-transitory computer readable medium of claim 15, wherein the received characteristics include at least one from a group comprising a battery temperature, a battery voltage, and a battery electrical current and wherein the received process parameters include at least one from a group comprising a charge rate for the battery, a state of charge of the battery, and a process temperature.

* * * * *